United States Patent
Walker

(10) Patent No.: US 7,471,753 B2
(45) Date of Patent: Dec. 30, 2008

(54) SERIALIZER CLOCK SYNTHESIZER

(75) Inventor: Samuel Walker, Tigard, OR (US)

(73) Assignee: Credence Systems Corporation, Milpitas, CA (US)

( * ) Notice: Subject to any disclaimer, the term of this patent is extended or adjusted under 35 U.S.C. 154(b) by 544 days.

(21) Appl. No.: 11/049,124

(22) Filed: Feb. 1, 2005

(65) Prior Publication Data

US 2006/0171450 A1  Aug. 3, 2006

(51) Int. Cl.
    *H04L 7/00* (2006.01)
(52) U.S. Cl. ............................................. 375/354
(58) Field of Classification Search ............ 375/224, 375/226, 354, 355, 357, 359, 360, 362, 365, 375/371, 326, 324, 322, 316; 327/141, 144, 327/164, 165, 172; 713/400, 401, 500, 501, 713/503, 600; 324/763
    See application file for complete search history.

(56) References Cited

U.S. PATENT DOCUMENTS

| | | | | |
|---|---|---|---|---|
| 4,979,185 | A | * | 12/1990 | Bryans et al. ............... 375/293 |
| 5,353,271 | A | * | 10/1994 | Abe ........................ 369/59.19 |
| 5,390,180 | A | * | 2/1995 | Reilly ........................ 370/476 |
| 5,930,294 | A | * | 7/1999 | Chapman ..................... 375/213 |
| 6,070,248 | A | * | 5/2000 | Yu et al. ...................... 713/501 |
| 2002/0060592 | A1 | * | 5/2002 | Shimoda ..................... 327/170 |
| 2004/0205827 | A1 | * | 10/2004 | Krone ........................ 725/131 |
| 2005/0135524 | A1 | * | 6/2005 | Messier ...................... 375/354 |

FOREIGN PATENT DOCUMENTS

EP  573104 A2 * 12/1993

* cited by examiner

Primary Examiner—Mohammad H Ghayour
Assistant Examiner—Vineeta S Panwalkar

(57) ABSTRACT

A clock synthesizer uses a serializer to convert a parallel data stream into clock signals. The frequency of the synthesized clock is dependent on the bit values of the parallel data stream and the frequency of the reference clock used by the serializer. Rapid tuning of the frequency is provided by changing the bit values of the parallel data stream. Fine tuning of the frequency is provided by changing the frequency of the reference clock. With this configuration, the clock device is capable of generating clock signals with very low jitter, is tunable to a very fine resolution in frequency, is able to skew to an external trigger with no glitches, and is able to hop to different frequencies with minimal delays. Moreover, the clock device can be designed at fairly low cost, because the serializer is widely available as a component in telecommunications applications.

6 Claims, 5 Drawing Sheets

SERIALIZER CLOCK SYNTHESIZER

BACKGROUND OF THE INVENTION

1. Field of the Invention

The present invention relates generally to clock synthesis, and more particularly, to a clock synthesizer that synthesizes a clock signal from a parallel data stream using a serializer.

2. Description of the Related Art

Most electronic systems employ a clock signal to control and synchronize the timing of operations that are carried out by them. In a system for testing electronic devices, multiple clocks are employed in various applications and each clock is selected, configured or designed based on its particular application. The main system clock, for example, is required to be extremely accurate. On the other hand, the clock that is used by analog modules of the test apparatus has the following requirements:

Low jitter (less than 2 picoseconds RMS);
Tunable to a very fine resolution in frequency;
Be able to skew to an external trigger with no glitches; and
Be able to hop to different frequencies with minimal delays.

Conventional clock designs have been inadequate in providing the requirements for the analog clock set forth above. Clocks that have the ability to provide low jitter and high accuracy, e.g., the type of clocks that are used as the main system clock, are typically unable to hop to different frequencies with minimal delays. Also, it is difficult to skew or align the phase of such clocks to an external signal, e.g., a trigger. Some conventional clocks allow for dynamic frequency changes, but they are not desirable because they introduce delays that are too long when hopping from one frequency to another.

Cost is often an additional requirement for analog clocks used in a test system, because they are installed in multiple devices, e.g., in each test instrument of the test system that contains an analog module. When low cost is added as a requirement in the design of an analog clock, it becomes even more evident that conventional clock designs are inadequate.

SUMMARY OF THE INVENTION

An object of the present invention is to provide a clock device that uses a serializer to convert a parallel data stream into clock signals. With this configuration, it is possible to provide a clock device that is capable of generating clock signals with very low jitter, is tunable to a very fine resolution in frequency, is able to skew to an external trigger with no glitches, and is able to hop to different frequencies with minimal delays. Moreover, the clock device can be designed at fairly low cost (about $400 or less), because the serializer, which is a major component of the clock device, has become widely available as a component in telecommunications applications and its cost has decreased accordingly.

The clock device according to an embodiment of the invention includes a serializer circuit having a parallel data input, a reference clock input and a serial data output, and a variable clock generating circuit coupled to the reference clock input. The serializer circuit can generate a serial data stream representing a synthesized clock signal through the serial data output based on parallel data received through the parallel data input.

The frequency of the clock signal synthesized by the clock device changes in accordance with changes in the frequency of the clock generated by the variable clock generating circuit and supplied to the reference clock input of the clock device. A numerically controlled oscillator is provided in the variable clock generating circuit to enable control over the changes in the frequency of the clock generated by the variable clock generating circuit.

The clock device further includes a programmable device with registers in which various parameters for controlling the frequency of the synthesized clock signal are stored. One such parameter is the numerical input to the numerically controlled oscillator of the variable clock generating circuit. The parameters also include two numerical settings that determine the bit values of the parallel data stream that is supplied to the serializer circuit. The first numerical setting determines the number of consecutive 1's that are to appear in the serial data stream converted from the parallel data stream. The second numerical setting determines the number of consecutive 0's that are to appear in the serial data stream converted from the parallel data stream.

Another object of the present invention is to provide a test instrument that includes a clock synthesizer. The test instrument according to an embodiment of the invention includes a clock synthesizer with a serializer circuit for generating a synthesized clock signal, and a signal processing module that uses the synthesized clock signal from the clock synthesizer.

Still another object of the present invention is to provide a method of generating clock signals with varying frequency from a parallel data stream. The method according to an embodiment of the invention includes the steps of converting a parallel data stream into a clock signal having a first frequency in accordance with a first set of control parameters, changing the control parameters, and converting a parallel data stream into a clock signal having a second frequency in accordance with a second, changed, set of control parameters.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
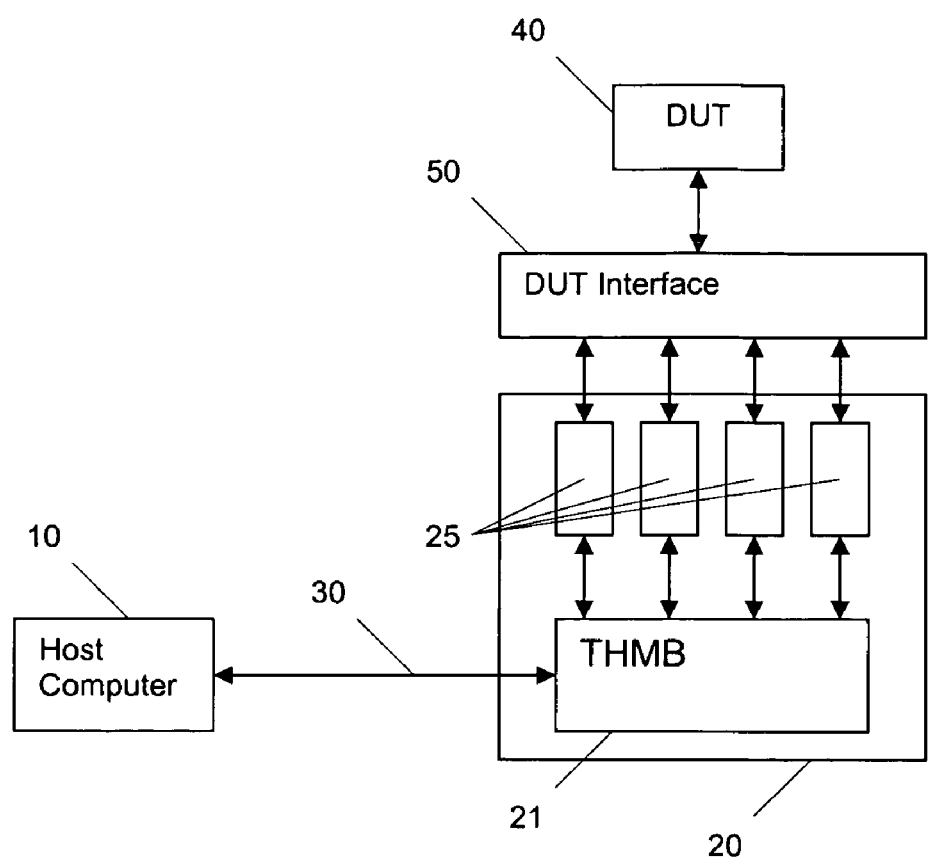
FIG. 1 is a block diagram of a test apparatus in which the present invention may be employed.

FIG. 1 is a block diagram of a test apparatus in which the present invention may be employed. The test apparatus includes a host computer 10 connected to a test head 20 over a PCI bridge 30. The test head 20 includes a test head motherboard (THMB) 21 to which a plurality of test instruments 25 is connected. The THMB 21 houses the master system clock (not shown). The test instruments 25 generate test signals and supply them to the device under test (DUT) 40 through the DUT interface 50. In response to the test signals, the DUT 40 generates response signals that are supplied to the test instruments 25 through the DUT interface 50. A test program that is executed by the host computer 10 controls the test process.

The test instruments 25 may include digital test instruments and analog test instruments. When the DUT 40 is a mixed-signal device, both digital and analog test instruments are used, such that the digital instruments are coupled to the digital pins of the DUT 40 and the analog instruments are coupled to the analog pins of the DUT 40. Analog instruments that supply analog test signals to the analog pins of the DUT 40 include digital-to-analog converters (DACs) and analog instruments that receive analog response signals from the analog pins of the DUT 40 include analog-to-digital converters (ADCs).

Figure 2:
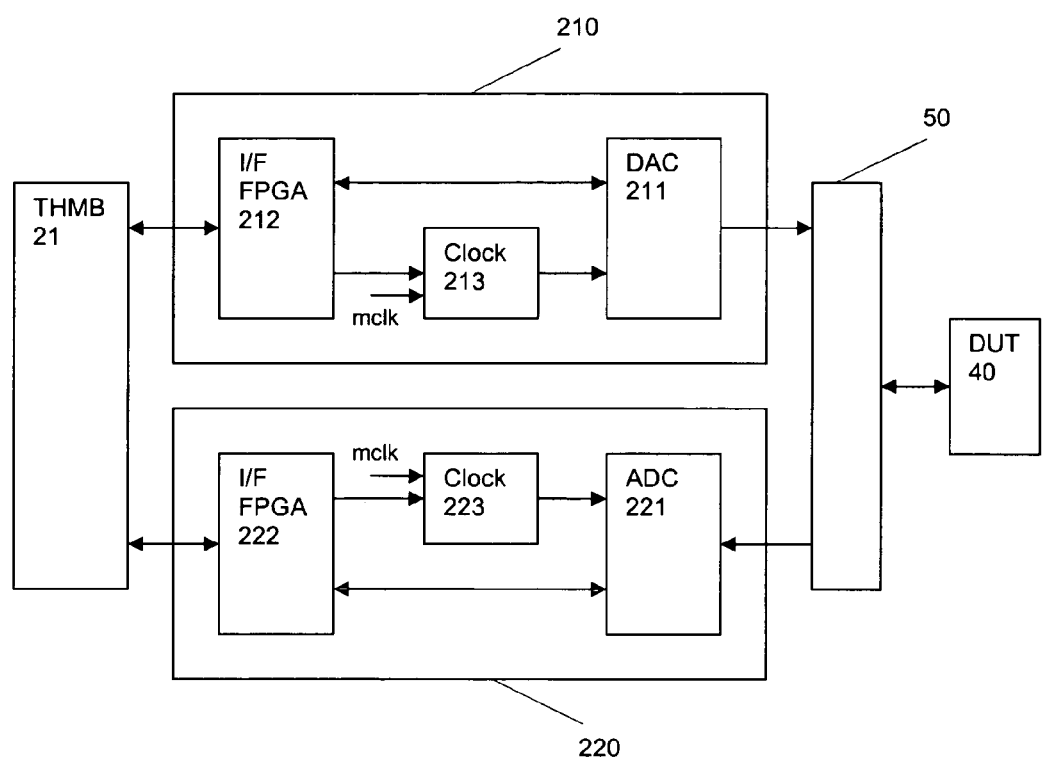
FIG. 2 is a block diagram of two instruments of the test apparatus of FIG. 1.

FIG. 2 is a block diagram of an analog instrument 210 that houses a DAC module 211 and an analog instrument 220 that houses an ADC module 221. The analog instrument 210 also houses an interface field programmable gate array (FPGA) 212 and a clock synthesizer 213. The analog instrument 220 also houses an interface FPGA 222 and a clock synthesizer 223.

The interface FPGA 212 and the interface FPGA 222 are programmed to communicate trigger signals, control signals and data signals to and from the THMB 21. The DAC module 211 receives control and data signals through the interface FPGA 212 and generates analog test signals for the DUT 40 based on these signals using a clock signal generated by the clock synthesizer 213. The ADC module 221 receives analog response signals from the DUT 40 through the DUT interface 50 and converts them to digital signals using a clock signal generated by the clock synthesizer 223.

The analog instrument 210 may be, for example, an analog waveform generator, or generally, an analog signal generating board. It generates the analog waveform specified in the test program and supplies it to the DUT 40. The analog instrument 220 may be, for example, an analog capture processor, or generally, an analog signal capture board. It samples the analog waveform received from the DUT 40. This board may comprise two ADC modules, one for capturing audio signals with high resolution and low sampling rate, and the other for capturing video signals with low resolution and high sampling rate.

Both of the clock synthesizers 213, 223 use the master system clock (mclk) and may be tuned to generate an output clock having a target frequency. The control parameters for tuning the clock synthesizers 213, 223 are specified in the test program and communicated to the clock synthesizers 213, 223 through the THMB 21 and the respective interface FPGAs 212, 222. The structure of the clock synthesizers 213 and 223 is otherwise identical and is illustrated in further detail in FIG. 3.

Figure 3:
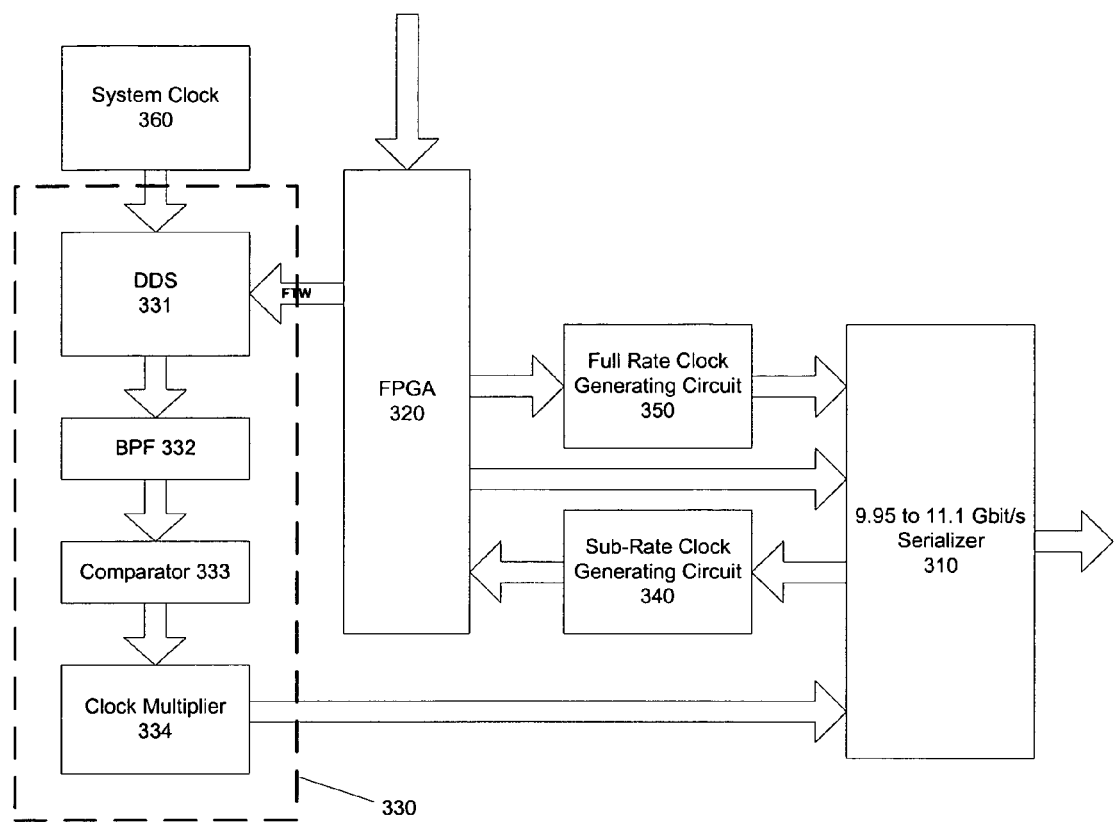
FIG. 3 is a block diagram of a clock synthesizer according to an embodiment of the invention.

FIG. 3 is a block diagram of a clock synthesizer according to an embodiment of the invention. It includes a serializer circuit 310 that receives a parallel data stream from an PGA 320 consisting of a pattern of 1's and 0's and serializes the parallel data stream into a serial data stream. The serial data stream output from the serializer circuit 310 represents the synthesized clock signal. The frequency of the synthesized clock signal is dependent on two factors: (i) the pattern of 1's and 0's in the parallel data stream; and (ii) the bit rate at which the serializer circuit 310 outputs the serial data stream. The following table illustrates the relationship between these two factors and the frequency of the synthesized clock signal.

TABLE 1

| Example | Number of consecutive 1's | Number of consecutive 0's | Bit rate (in Gbit/s) | Clock frequency (in MHz) |
|---|---|---|---|---|
| 1 | 40 | 40 | 10.0 | 125.0 |
| 2 | 20 | 20 | 10.0 | 250.0 |
| 3 | 30 | 30 | 10.0 | 166.7 |
| 4 | 20 | 10 | 10.0 | 333.3 |
| 5 | 10 | 30 | 10.0 | 250.0 |
| 6 | 22 | 22 | 11.0 | 250.0 |
| 7 | 20 | 20 | 11.0 | 275.0 |
| 8 | 30 | 30 | 11.0 | 183.3 |
| 9 | 20 | 10 | 11.0 | 366.7 |
| 10 | 10 | 30 | 11.0 | 275.0 |

The duty cycle of the synthesized clock signal is dependent on the ratio of 1's and 0's in the parallel data stream. If the number of consecutive 1's in the pattern (N1) is equal to the number of consecutive 0's (N0) in the pattern, then the duty cycle is 50%. The duty cycle is calculated using the following formula: duty_cycle (%)=100%*N1/(N1+N0). The duty cycle for examples 4 and 9 above is 66.7% (=100%*20/(20+10)). The duty cycle for examples 5 and 10 above is 25% (=100%*10/(10+30)).

The FPGA 320 includes control registers that store the settings for consecutive 1's and consecutive 0's. These settings are specified by the test program and received by the FPGA 320 from the interface FPGA 212 or 222. In the embodiment of the clock synthesizer illustrated in FIG. 3, the FPGA 320 requires two clocks. The first clock is used in supplying the parallel data to the serializer circuit 310. The second clock is used for other operations of the FPGA 320. The first clock is derived from the reference clock of the serializer circuit 310, which is supplied by a variable reference clock generating circuit 330 to the serializer circuit 310 and supplied from the serializer circuit 310 to a sub-rate clock generating circuit 340. The sub-rate clock generating circuit 340 produces a one-half rate clock (reference clock frequency*½), which corresponds to the first clock used by the FPGA 320, and a one-quarter rate clock (reference clock frequency*¼), which corresponds to the second clock used by the FPGA 320. The FPGA 320 outputs the parallel data stream on both edges of the first clock. Therefore, its effective output frequency is the full rate. A full rate clock generating circuit 350 is used to convert the one-half rate clock to a full rate clock, and this full rate clock is used to clock in the parallel data stream into the serializer circuit 310.

The bit rate at which the serializer circuit 310 outputs the serial data stream depends on the reference clock that is supplied by the variable reference clock generating circuit 330. The variable reference clock generating circuit 330 includes a direct digital synthesis (DDS) circuit 331, a differential bandpass filter 332, a comparator 333, and a clock multiplier 334. The DDS circuit 331 uses a system clock 360 as its reference clock and includes a numerical oscillator that is tuned to generate clock signals of varying frequency with extremely high resolution. The numerical oscillator is tuned using a frequency tune word that is stored in the FPGA 320. A change in the frequency tune word causes a change in the frequency of the clock signal output from the numerical oscillator and all clock signals that are downstream of the numerical oscillator including the reference clock output from the variable reference clock generating circuit 330. The differential bandpass filter 332 filters out undesired frequencies in the clock signal generated by the DDS circuit 331. The comparator 333 converts the waveform of the clock signal output from the bandpass filter 332 into a square waveform. The clock multiplier 334 multiplies the clock signal output from the comparator 333 so that its frequency will be in the range of input frequencies permitted by the serializer circuit 310.

The clock synthesizer according to an embodiment of the invention may be configured as follows. The serializer circuit 310 is a 16:1 high-speed serializer chip that is commercially available from Applied Micro Circuits Corporation (Part No. S19235). It takes in parallel 16-bit data at 622 MHz to 694 MHz and generates a 9.95 to 11.1 Gbit/s serial data stream with very low jitter. The FPGA 320 is a Xilinx Vertex2 Pro 4 chip. The FPGA 320 is programmed to generate the parallel data stream in accordance with a data pattern defined by two settings. The first setting specifies the number of consecutive 1's that are to appear in the resulting serial data stream and the second setting specifies the number of consecutive 0's that are to appear in the resulting serial data stream. These two settings are stored in control registers of the FPGA 320.

The FPGA 320 also has a control register that stores a 48-bit frequency tune word (FTW) that determines the frequency of the clock signal output from the DDS circuit 331. The DDS circuit 331 is a DDS modulator chip that is commercially available from Analog Devices, Inc. (Part No. AD9956). It can run with any reference clock input up to 400 Hz. The system clock 360 which is supplied to the reference clock input of the DDS circuit 331 is set to run at 400 MHz. Depending on the value of the FTW, the clock signal output of the DDS circuit 331 is at 38.8 to 43.4 MHz. The output frequency of the DDS circuit 331 is determined by the following formula: DDS frequency=$FTW*400\times10^6/2^{48}$. The frequency band of the differential bandpass filter 332 is set at 35 to 45 MHz. Any clock signal that is outside of this frequency band is filtered out by the differential bandpass filter 332. The clock multiplier 334 is set to multiply its input frequency by 16. With this configuration, the frequency of the serializer will end up being 256 times the DDS frequency.

Figure 4:
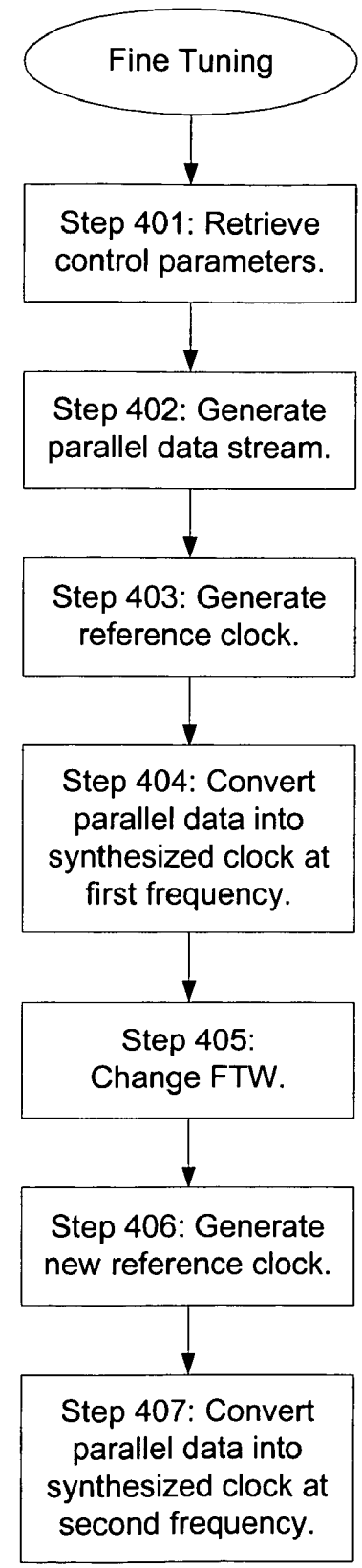
FIG. 4 is a flow diagram illustrating the steps of dynamically adjusting a clock frequency according to an embodiment of the invention.
Figure 5:
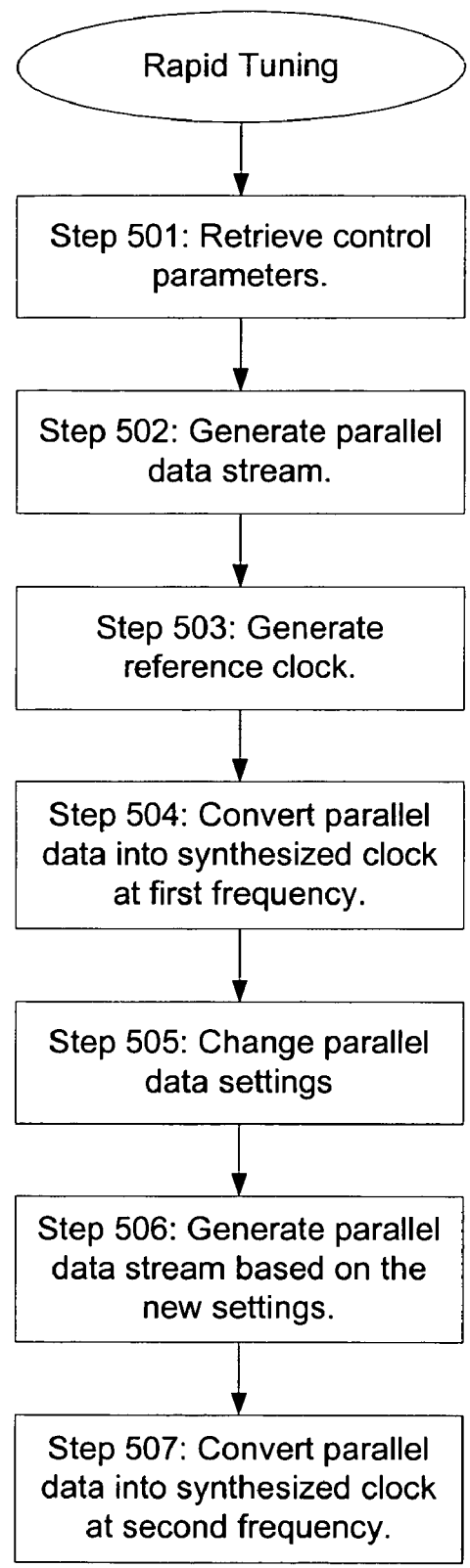
FIG. 5 is a flow diagram illustrating the steps of dynamically adjusting a clock frequency according to another embodiment of the invention.

FIGS. 4 and 5 are flow diagrams illustrating the steps of dynamically adjusting a clock frequency of the clock synthesizer output from a first frequency of 275 MHz to a second frequency of 250 MHz. In this illustration, the first frequency is obtained using the settings corresponding to Example 7 in Table 1 above. Two ways of adjusting the frequency of the synthesized clock are described below.

According to one method, the frequency of the synthesized clock is adjusted by changing the FTW stored in the FPGA 320. This method is illustrated in FIG. 4. In Step 401, the control parameters that determine the frequency of the synthesized clock are retrieved from the FPGA 320. In Step 402, the FPGA 320 produces a parallel data stream based on these settings (according to Example 7, 1's setting=20, 0's setting=20). In Step 403, the reference clock for the serializer circuit 310 is generated based on the FTW stored in the FPGA 320 (in Example 7, FTW that will generate a serial data rate of 11.0 Gbit/s is 30,236,569,763,840). In Step 404, the parallel data is converted into serial data by the serializer circuit 310 and a clock running at 275 MHz is synthesized. In Step 405, the FTW stored in the FPGA 320 is changed so as to obtain the target frequency of 250 MHz. A change in the FTW to 27,487,790,694,400 will result in the generation of a new reference clock (Step 406). In Step 407, the parallel data is converted into serial data using the new reference clock and a clock running at the target frequency of 250 MHz is synthesized (see Example 2 in Table 1 above).

According to another method, the frequency of the synthesized clock is adjusted by changing the parallel data settings stored in the FPGA 320. This method is illustrated in FIG. 5.

In Step 501, the control parameters that determine the frequency of the synthesized clock are retrieved from the FPGA 320. In Step 502, the FPGA 320 produces a parallel data stream based on these settings (according to Example 7, 1's setting=20, 0's setting=20). In Step 503, the reference clock for the serializer circuit 310 is generated based on the FTW stored in the FPGA 320 (in Example 7, FTW that will generate a serial data rate of 11.0 Gbit/s is 30,236,569,763,840). In Step 504, the parallel data is converted into serial data by the serializer circuit 310 and a clock running at 275 MHz is synthesized. In Step 505, the parallel data settings stored in the FPGA 320 are changed so as to obtain so as to obtain the target frequency of 250 MHz. A change in the 1's setting to 22 and the 0's setting to 22 will result in the generation of a new parallel data (Step 506). In Step 507, the new parallel data is converted into serial data and a clock running at the target frequency of 250 MHz is synthesized (see Example 6 in Table 1 above).

The first method described above permits fine tuning of the frequency. In Example 7, a change in the FTW by one will result in a target frequency change of just 0.000009 Hz (or 9 μHz). The second method described above permits rapid tuning of frequency and is ideal for frequency hopping applications, because only the bit values of the parallel data are changed and does not have to wait for devices to lock onto new frequencies. By contrast, with the fine tuning method, whenever the frequency of the reference clock that is supplied to the serializer circuit 310 is changed, it takes time (few milliseconds) for the serializer circuit 310 to lock onto the new reference frequency. Such delays are not desirable for frequency hopping applications.

Frequency hopping may be employed, for example, during generation of an analog video waveform. The video signal corresponding to the forward scan contains a lot of information so a high sampling rate is used to generate this signal. On the other hand, the video signal corresponding to the backward scan contains very little information so the sampling rate is turned way down to conserve pattern memory. Other examples of where frequency hopping may be employed include testing of chips at lots of different frequencies, and testing of chips across its standard operating frequency range.

While the foregoing is directed to embodiments of the present invention, other and further embodiments of the invention may be devised without departing from the basic scope thereof, and the scope thereof is determined by the claims that follow.

What is claimed is:

1. A clock synthesizer comprising:
   a serializer circuit having a parallel data input, a reference clock input and a serial data output, the serializer circuit being configured to generate serial data representing a synthesized clock signal through the serial data output based on parallel data received through the parallel data input;
   a variable clock generating circuit coupled to the reference clock input of the serializer circuit; and
   a device coupled to the parallel data input of the serializer circuit, the device being programmed to generate the parallel data to be supplied to the parallel data input of the serializer circuit;
   wherein the serializer circuit further includes a parallel clock input through which a parallel clock that is used to clock in the parallel data is received and a clock output through which a clock is supplied to the device.

2. The clock synthesizer according to claim 1, wherein the frequency of the synthesized clock signal changes in accordance with changes in the frequency of the clock generated by the variable clock generating circuit.

3. The clock synthesizer according to claim 2, wherein the variable clock generating circuit comprises a numerically controlled oscillator that provides control over the changes in the frequency of the clock generated by the variable clock generating circuit.

4. The clock synthesizer according to claim 1, wherein the device has registers that store control parameters of the clock synthesizer including control parameters that determine bit values of the parallel data to be supplied to the parallel data input of the serializer circuit.

5. The clock synthesizer according to claim 4, wherein the control parameters further include control parameters that determine the frequency of the clock generated by the variable clock generating circuit.

6. The clock synthesizer according to claim 1, wherein the parallel clock is derived from the clock supplied to the device.

* * * * *